United States Patent [19]
Hashimoto

[11] Patent Number: 5,523,614
[45] Date of Patent: Jun. 4, 1996

[54] BIPOLAR TRANSISTOR HAVING ENHANCED HIGH SPEED OPERATION THROUGH REDUCED BASE LEAKAGE CURRENT

[75] Inventor: Takasuke Hashimoto, Tokyo, Japan

[73] Assignee: NEC Corporation, Tokyo, Japan

[21] Appl. No.: 357,215

[22] Filed: Dec. 13, 1994

[30] Foreign Application Priority Data

Dec. 15, 1993 [JP] Japan .................... 5-342851

[51] Int. Cl.⁶ .............. H01L 27/082; H01L 27/102; H01L 29/70; H01L 29/00
[52] U.S. Cl. .............. 257/578; 257/588; 257/592; 257/514; 257/515
[58] Field of Search .................... 257/578, 587, 257/588, 591, 514, 515, 592

[56] References Cited

FOREIGN PATENT DOCUMENTS 61-112378  5/1986  Japan ................ 257/588
64-15973   1/1989  Japan ................ 257/588

*Primary Examiner*—Steven H. Loke
*Attorney, Agent, or Firm*—Popham, Haik, Schnobrich & Kaufman, Ltd.

[57] ABSTRACT

A semiconductor device includes an n-type low-resistance region (2) formed on a p-type monocrystalline semiconductor substrate (1), an n-type epitaxial layer (3) formed on the n-type low-resistance region (2), an insulating film (5) formed on the n-type epitaxial layer (3) and having a first opening selectively formed therein, and an n-type polysilicon film (8) having an overhung portion extending from the entire peripheral portion of the opening to the inside of the opening. An n-type polysilicon film (9) is formed downward from the bottom surface of the overhung portion, and a p-type monocrystalline silicon film (6) serving as a base is formed on the surface of the n-type epitaxial layer in the first opening. The base (6) is in contact with the n-type polysilicon films (8, 9), and the n-type emitter (10) is formed immediately below the n-type emitter polysilicon films (8, 9) to have an annular shape.

5 Claims, 5 Drawing Sheets

BIPOLAR TRANSISTOR HAVING ENHANCED HIGH SPEED OPERATION THROUGH REDUCED BASE LEAKAGE CURRENT

BACKGROUND OF THE INVENTION

1. Field of the Invention

The present invention relates to a semiconductor device and, more particularly, to the structure of a bipolar transistor.

2. Description of the Prior Art

Transistors have been decreased in size to obtain high-speed, high-density LSIs. In particular, in a bipolar transistor, with a decrease in emitter size, a variation in emitter area and a decrease in cut-off frequency caused by an increase in current density have been posed as problems. For this reason, methods of increasing an emitter area without changing a base area are studied, and one of these methods has been proposed in Japanese Patent Laid-Open No. 61-112378. In a transistor according to this prior art, a base contact region is arranged at the central portion of the transistor, and an annular emitter region is formed around the base contact region. In this transistor, an emitter region having an area twice that of a general transistor can be assured without increasing a base area. For this reason, the transistor of the above-mentioned first prior art allows a larger current to follow.

FIG. 1 is a view showing the above structure. A silicon dioxide film 22 and a silicon nitride film 23 are formed on a silicon substrate 21, and a polysilicon film 24 is formed on these films through openings formed therein. Boron and arsenic are doped in the polysilicon film 24, and then thermally diffused in the silicon substrate 21 to from a base 25 and an emitter 26. A graft base 27 is formed in advance by ion implantation of boron.

Note that reference numeral 28 denotes an insulating film; 29, a base electrode; and 30, an emitter electrode. In this manner, the transistor is constituted as a transistor having a ring-like emitter.

In Japanese Patent Laid-Open No. 64-15973, an annular emitter region formed by the same method as that of forming the above structure is described.

However, the following problem is posed in the above conventional transistor having the annular emitter. More specifically, boron and arsenic doped in the polysilicon film 24 are thermally diffused in the monocrystalline substrate 21 so as to form the base 25 and the emitter 26, thereby forming the annular emitter. However, in this method, each impurity cannot be easily diffused with good controllability. For this reason, desired base and emitter cannot be easily formed, and a variation in element becomes large.

The same problem as described above is also posed in a transistor described in Japanese Patent Laid-Open No. 64-15973 using a method of forming a base region and then forming an emitter region in the base region.

Therefore, the following structure described in Japanese Patent Application No. 3-79388 is considered. That is, an epitaxial base layer is formed using a selective epitaxial growing method such as a UHV/CVD (Ultra High Vacuum/Chemical Vapor Deposition) method, and an emitter is formed in the epitaxial base layer.

More specifically, as shown in FIG. 2, an n-type low-resistance region 32 is formed on a p-type silicon substrate 31, and an n-type silicon epitaxial layer 33 is formed on the n-type low-resistance region 32. Reference numeral 34 denotes an isolation region; and 35, an insulating interlayer. Reference numeral 36 denotes a collector extracting polysilicon layer; 37, a $p^+$-type polysilicon layer for connecting an external base to a base electrode 38; and 39, an insulating film. Reference numeral 40 denotes a side wall for achieving insulation; 41, an epitaxial base layer; 42, a polysilicon film for connecting the epitaxial base layer 41 to the polysilicon layer 37. Reference numeral 43 denotes an emitter extracting polysilicon film; and 44, an emitter diffusion layer. Reference numeral 45 denotes an emitter electrode; and 46, a collector electrode.

In the above transistor, the n-type polysilicon film 37 is used in place of the emitter diffusion layer 44, and an impurity is thermally diffused from the polysilicon layer 37 into the epitaxial base layer 41. In this case, an annular emitter diffusion layer can be formed around the epitaxial base layer 41. When the transistor is formed by this method, it is apparent that the base can be formed with good controllability in concentration and thickness. Since the base can be decreased in size in the horizontal direction, a bipolar transistor having a high cut-off frequency and a small parasitic capacitance can be formed.

However, the following problems are posed. That is, first, the epitaxial base layer 41 is grown, and, at the same time, the polysilicon film 42 is grown on the bottom surface of the n-type polysilicon film 37. For this reason, if an n-type impurity is not satisfactorily diffused, a base-emitter junction is formed in the polysilicon film 42, thereby causing an increase in base leakage current.

Second, since the emitter is formed under the overhung portion of the n-type polysilicon layer 37, the concentration of the silicon epitaxial layer 33 immediately below the formed emitter diffusion layer cannot be selectively increased by ion implantation. For this reason, a Kirk effect easily occurs, thereby degrading the high-frequency characteristics of the transistor.

Therefore, the method of manufacturing a transistor shown in FIG. 2 cannot be applied to manufacture a transistor having an annular emitter diffusion layer without any problem, and the method cannot be actually applied.

SUMMARY OF THE INVENTION

It is an object of the present invention to provide a semiconductor device which solves the above problems and comprises a transistor having a high cut-off frequency and a high-speed operation.

In order to achieve the above object, according to the present invention, there is provided a semiconductor device comprising a low-resistance region of a second conductivity type formed on a monocrystalline semiconductor substrate of a first conductivity type, a first monocrystalline semiconductor film of the second conductivity type formed on the low-resistance region, a first insulating film formed on a surface of the first monocrystalline semiconductor film and having a first opening, a first polycrystalline semiconductor film of the second conductivity type formed on the first insulating film and having a horizontal overhung portion extending from an entire peripheral portion of the first opening to an inside of the first opening to have a predetermined length, a second polycrystalline semiconductor film of the second conductivity type formed downward from a bottom surface of the overhung portion, and a second monocrystalline semiconductor film of the first conductivity type formed on a surface of said first monocrystalline semiconductor film in said first opening, wherein the second polycrystalline semiconductor film and the second monocrystalline semiconductor film are connected to each other in the first opening, and a diffusion layer of the second conductivity type is formed in the second monocrystalline semiconductor film.

More preferably, the semiconductor device may be arranged such that a third monocrystalline semiconductor film of the second conductivity type extending from the surface of the first monocrystalline semiconductor film of the second conductivity type to the low-resistance region of the second conductivity type is formed on the first monocrystalline semiconductor film of the second conductivity type immediately below a second opening surrounded by a second insulating film in the first opening.

DETAILED DESCRIPTION OF THE PREFERRED EMBODIMENTS

Figure 1:
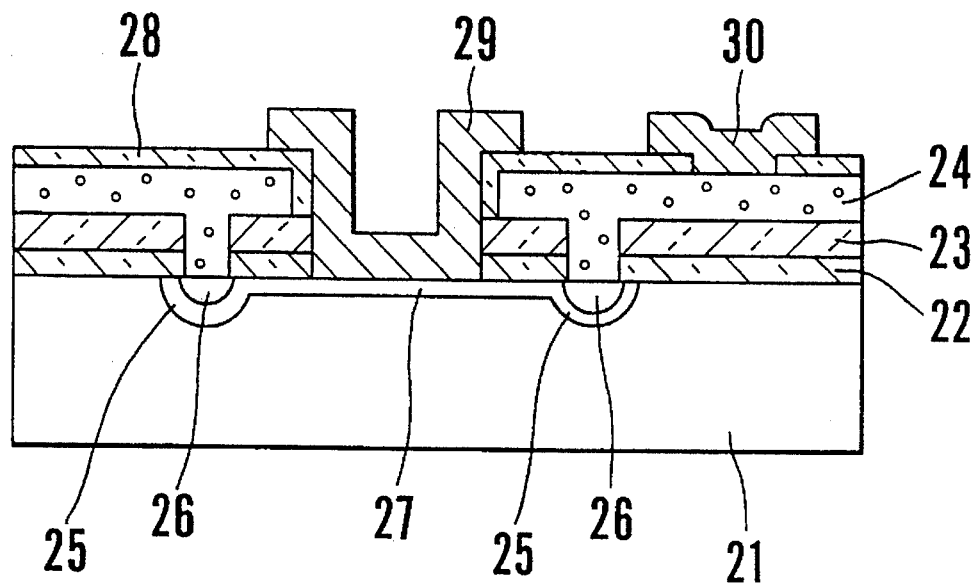
FIG. 1 is a sectional view showing a conventional semiconductor device according to the first prior art.
Figure 2:
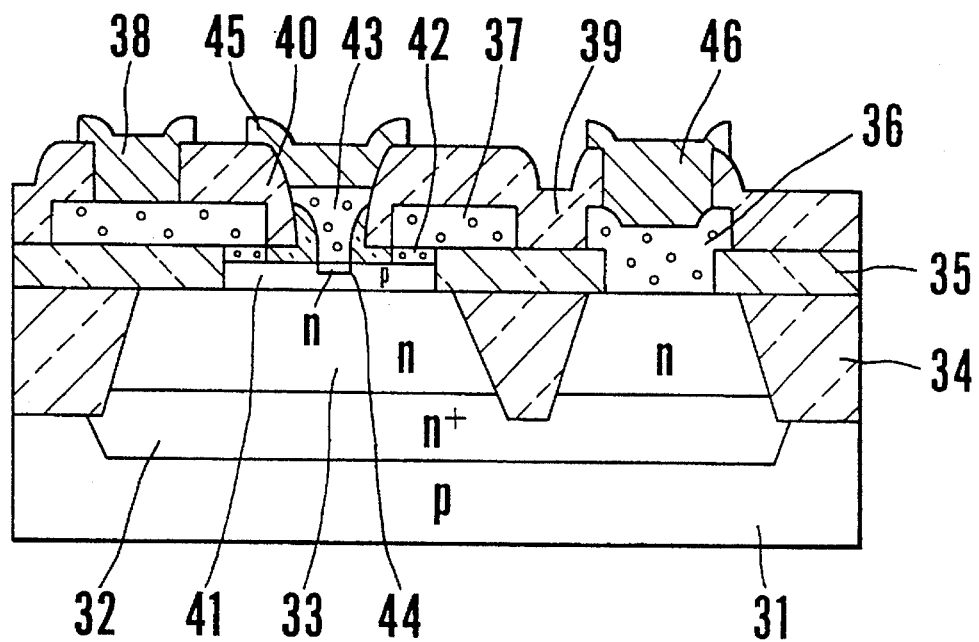
FIG. 2 is a sectional view showing a conventional semiconductor device according to the second prior art.
Figure 3A:
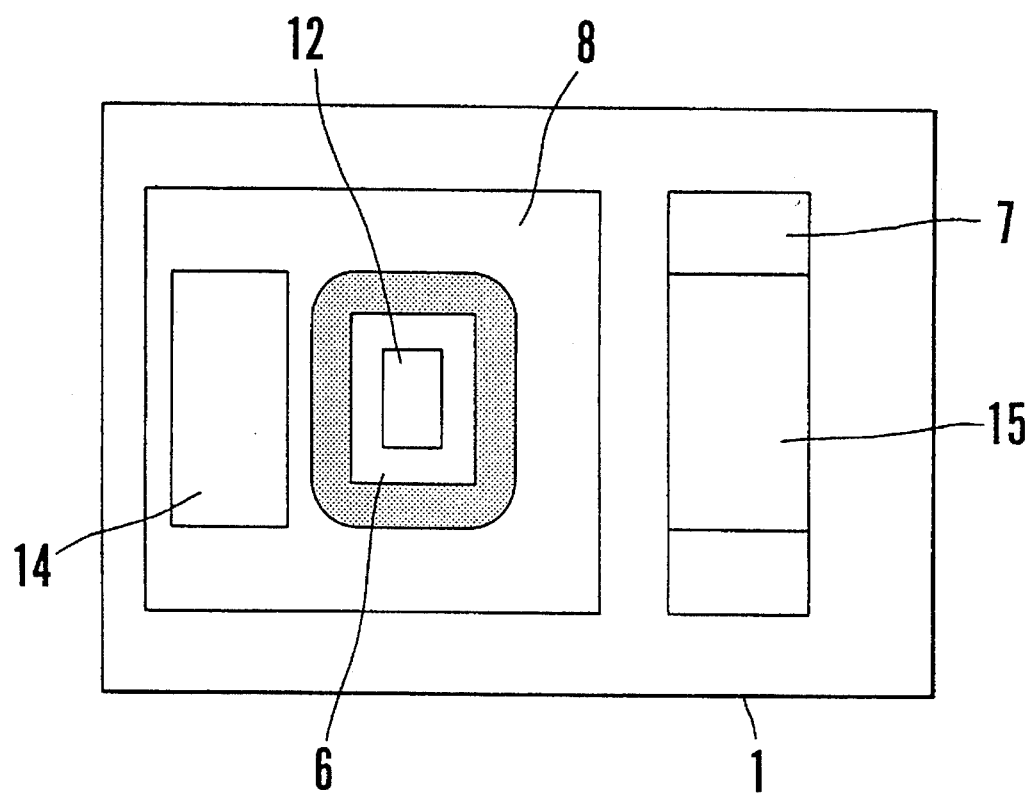
FIG. 3A is a plan view showing a semiconductor device according to the first embodiment of the present invention.
Figure 3B:
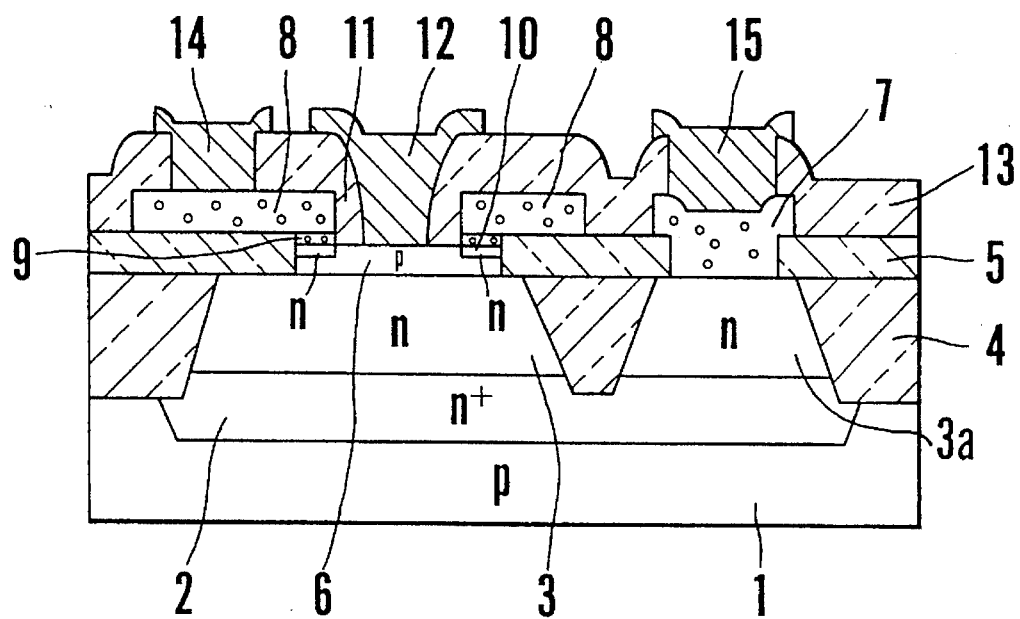
FIG. 3B is a sectional view showing the semiconductor device according to the first embodiment.

The present invention will be described below with reference to the accompanying drawings. FIG. 3A is a plan view of the first embodiment of the present invention, and FIG. 3B is a sectional view of the first embodiment of the present invention. An n$^+$-type low-resistance region 2 is formed in the element formation region of a p-type silicon substrate 1, and an n-type silicon epitaxial layer 3 is formed on the n$^+$-type low-resistance region 2. An element region is defined by a silicon oxide film 4 serving as a thick isolation region, and a collector extracting region 3a is formed by part of the silicon oxide film 4. An insulating interlayer 5 is formed on the surface of the n-type silicon epitaxial layer 3, and a p-type epitaxial base layer 6 serving as a base is formed in a window formed in the insulating interlayer 5. A collector extracting polysilicon film 7 is formed near the opening of the insulating interlayer 5 in the collector extracting region 3a.

In addition, an n-type emitter polysilicon film 8 is formed on the insulating interlayer 5 around the p-type epitaxial base layer 6 so as to partially overlap the p-type epitaxial base layer 6 through a polysilicon film 9, and an n-type emitter diffusion layer 10 is formed on a portion, of the p-type epitaxial base layer 6, having an annular shape when viewed from the upper direction and overlapping the n-type emitter polysilicon film 8. An annular insulating side wall 11 is formed in a region inside the n-type emitter polysilicon film 8, and a base electrode 12 connected to the p-type epitaxial base layer 6 is formed on the insulating side wall 11. An emitter electrode 14 and a collector electrode 15 are formed through windows formed in a second insulating interlayer 13 for forming the insulating side wall 11. Note that these electrodes consist of aluminum.

In this case, as shown in FIG. 3A, on the p-type epitaxial base layer 6, the n-type emitter diffusion layer 10 is formed along the peripheral portion of the p-type epitaxial base layer 6 to have an annular shape. Therefore, in the transistor with the above arrangement, a base or an emitter can be formed with good controllability, and an emitter-base junction is formed in the epitaxial base layer 6. For this reason, the transistor is free from a problem such as base leakage.

In addition, the transistor can be constituted as a high-speed bipolar transistor having a high cut-off frequency and a small parasitic capacitance.

Figure 4A:
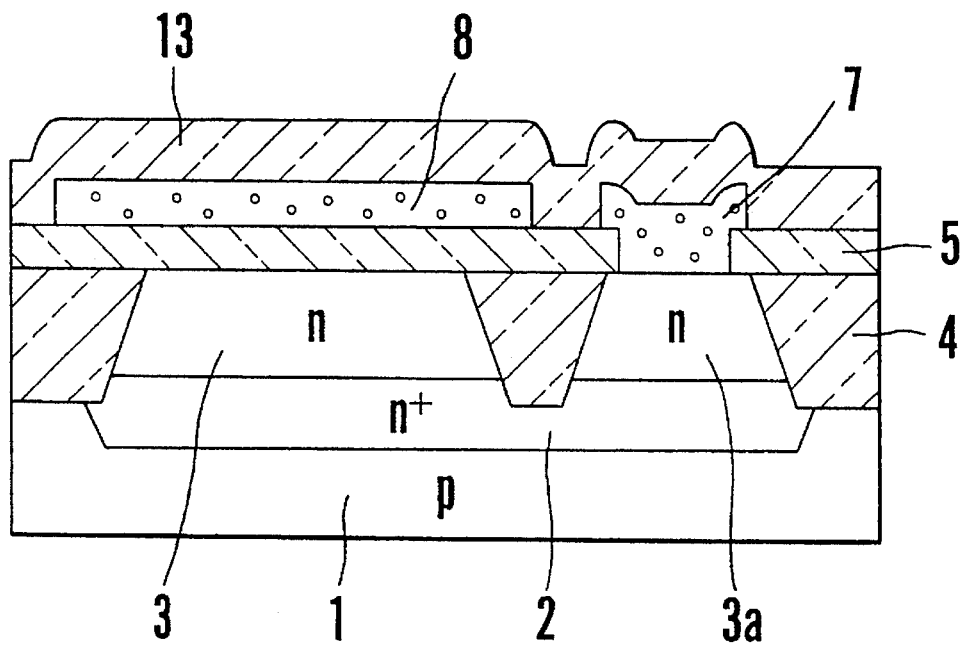
FIGS. 4A to 4D are sectional views showing the steps in manufacturing the semiconductor device shown in FIGS. 3A and 3B.

FIGS. 4A to 4D are sectional views showing the steps in manufacturing the transistor shown in FIGS. 3A and 3B. As shown in FIG. 4A, the n$^+$-type low-resistance region 2 is formed in an element region on the surface of the p-type silicon substrate 1 by ion implantation or the like, and the n-type silicon epitaxial layer 3 is formed on the surface of the n$^+$-type low-resistance region 2. A nitride film (not shown) is selectively formed on the surface of the n-type silicon epitaxial layer 3, and thermal oxidation is performed using the nitride film as a mask, thereby forming the silicon oxide film 4 as an isolation region by a so-called LOCOS method.

The insulating interlayer 5 is deposited on the entire surface of the resultant structure. The thickness of the insulating interlayer 5 defines the final base thickness. In this case, the thickness of the insulating interlayer 5 is set to be 1,500 Å. The insulating interlayer 5 is selectively etched to form a window for the collector extracting region 3a. A polysilicon film is formed on the entire surface of the resultant structure, and this polysilicon film is etched to be patterned, thereby forming the collector extracting polysilicon film 7 and the n-type emitter polysilicon film 8. An n-type impurity is ion-implanted in the emitter polysilicon film 8 to set the impurity concentration of the n-type emitter polysilicon film 8 to be, e.g., 1E20 cm$^{-3}$. In this state, the second insulating interlayer 13 is formed on the entire surface of the resultant structure.

Figure 4B:
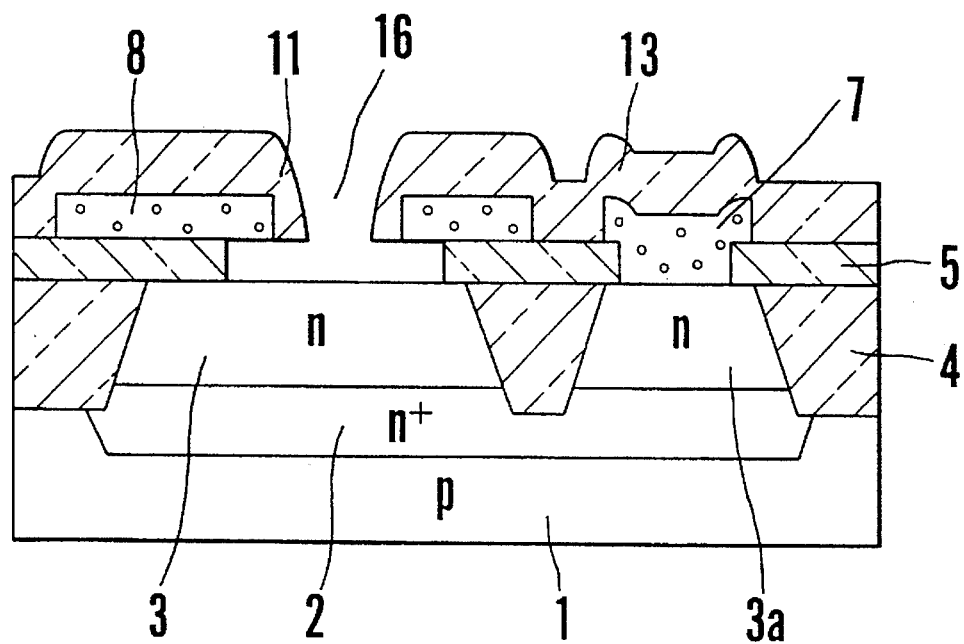

As shown in FIG. 4B, the second insulating interlayer 13 and the n-type emitter polysilicon film 8 are removed by anisotropical etching at a portion prospectively serving as a base contact portion to form a base contact hole 16. In addition, an insulating film is deposited on the entire surface of the resultant structure, and this insulating film is anisotropically etched to form the insulating side wall 11 around the base contact hole 16. Wet etching is performed through the base contact hole 16 in the insulating side wall 11 to side-etch the insulating interlayer 5 until the bottom surface of the n-type emitter polysilicon film 8 is exposed.

Figure 4C:
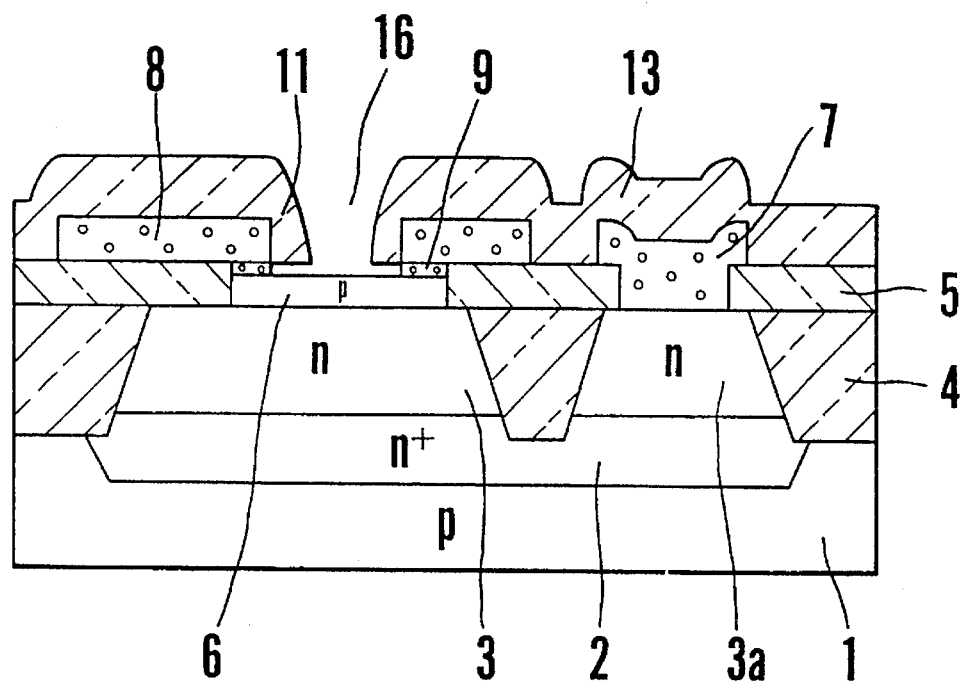

As shown in FIG. 4C, an epitaxial base layer 6 is formed by a selective epitaxial growing method on the n-type silicon epitaxial layer 3 exposed by the side etching. At this time, the polysilicon film 9 is grown on the exposed bottom surface of the n-type emitter polysilicon film 8. Finally, the p-type epitaxial base layer 6 is naturally brought into contact with the polysilicon film 9, and the p-type epitaxial base layer 6 is electrically connected to the polysilicon film 9. In this case, using Si$_2$H$_6$ as a source gas for a growth process and B$_2$H$_6$ as an n-type boron doping gas, a selective growing process can be performed at a temperature of 560°, a pressure of 2×10$^{-5}$ Torr, an Si$_2$H$_6$ flow rate of 70 sccm, and a growth rate of 7 nm/min. A base thickness is set to be 1,000 Å, and a concentration is set to be 5E18 cm$^{-3}$.

Figure 4D:
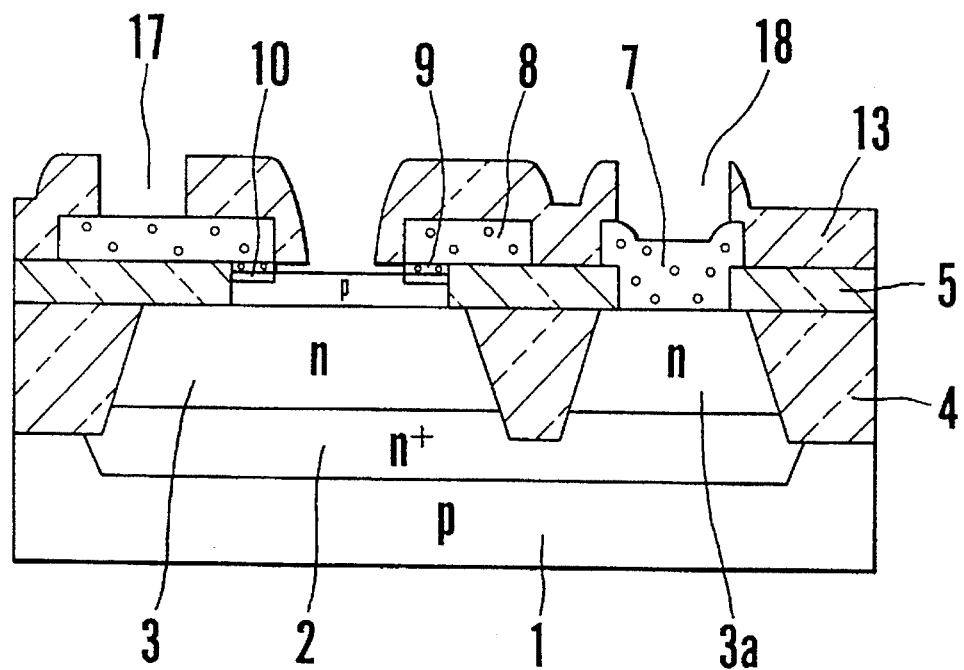

As shown in FIG. 4D, an emitter contact hole 17 and a collector contact hole 18 are formed in the second insulating interlayer 13. An n-type impurity is thermally diffused from the n-type emitter polysilicon film 8 into the p-type epitaxial base layer 6 through the polysilicon film 9, thereby forming the n-type emitter diffusion layer 10. This annealing is satisfactorily performed at 1,050° C. for about 30 seconds.

Thereafter, an aluminum film is deposited on the resultant structure and then patterned to form the base electrode 12, the emitter electrode 14, and the collector electrode 15. In this manner, the transistor shown in FIGS. 3A and 3B is completed.

Note that, in the bipolar transistor of this embodiment, the conditions for selective epitaxial growth are optimized, and although the growth ratio of the polysilicon film 9 on the bottom surface of the n$^+$-type emitter polysilicon film 8 to the epitaxial base layer 6 is generally set to be 1:1, the polysilicon film 9 and the p-type epitaxial base layer 6 are grown at a rate of 1:2 to suppress growth of the polysilicon film. In this manner, the emitter-base junction is formed in the epitaxial base layer 6 under a smaller number of annealing conditions.

Figure 5:
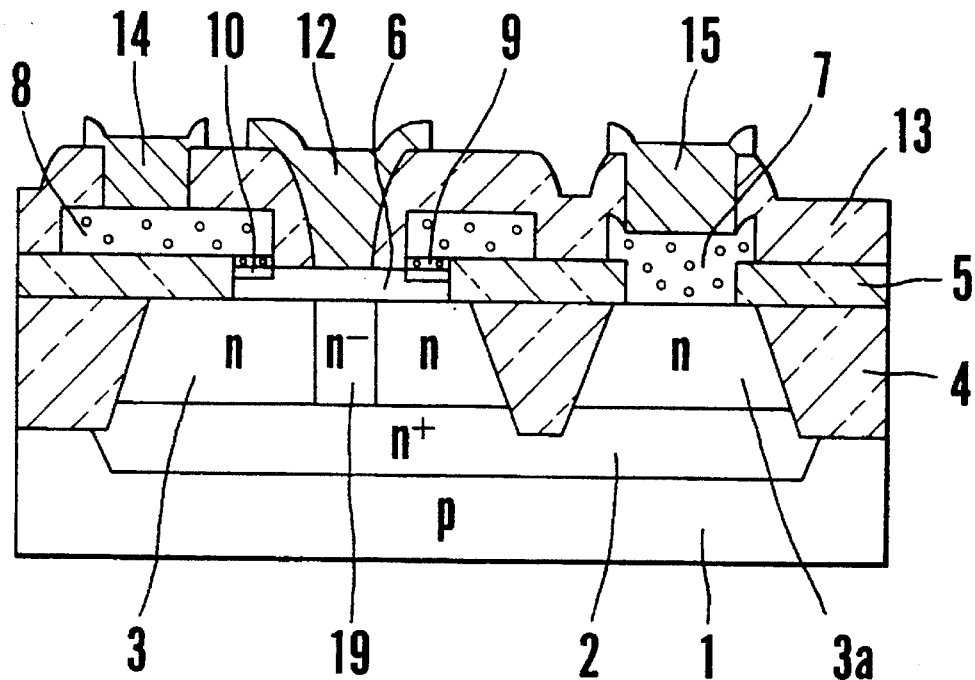
FIG. 5 is a sectional view showing a semiconductor device according to the second embodiment of the present invention.

The second embodiment of the present invention will be described below. FIG. 5 is a sectional view of the second embodiment of the present invention. The same reference numerals as in the first embodiment denote the same parts in the second embodiment. In the second embodiment, a lightly doped collector epitaxial layer 19 is formed in an n-type silicon epitaxial layer 3 immediately below a base electrode 12. More specifically, when the concentration of the silicon epitaxial layer 3 immediately below an emitter diffusion layer 10 is low, the Kirk effect easily occurs, and the high-frequency characteristics of the transistor are degraded. As a measure against this drawback, the silicon epitaxial layer 3 is formed to have a concentration higher than that of a conventional silicon epitaxial layer. In this case, however, the collector concentration of a region except for the region immediately below the emitter increases. For this reason, the capacitance of the base-emitter junction increases, thereby avoiding a high-speed operation of the transistor.

Therefore, the concentration of only a portion immediately below the n-type emitter diffusion layer 10 is preferably increased by ion implantation or the like. However, in the arrangement shown in FIGS. 3A and 3B, since the portion immediately below the emitter diffusion layer 10 is in the shadow of the overhung of the n$^+$-type emitter polysilicon film 8, this method cannot be utilized. For this reason, an increase in capacitance of the base-collector junction is prevented by forming the lightly doped collector epitaxial layer 19 as described above.

Figure 6:
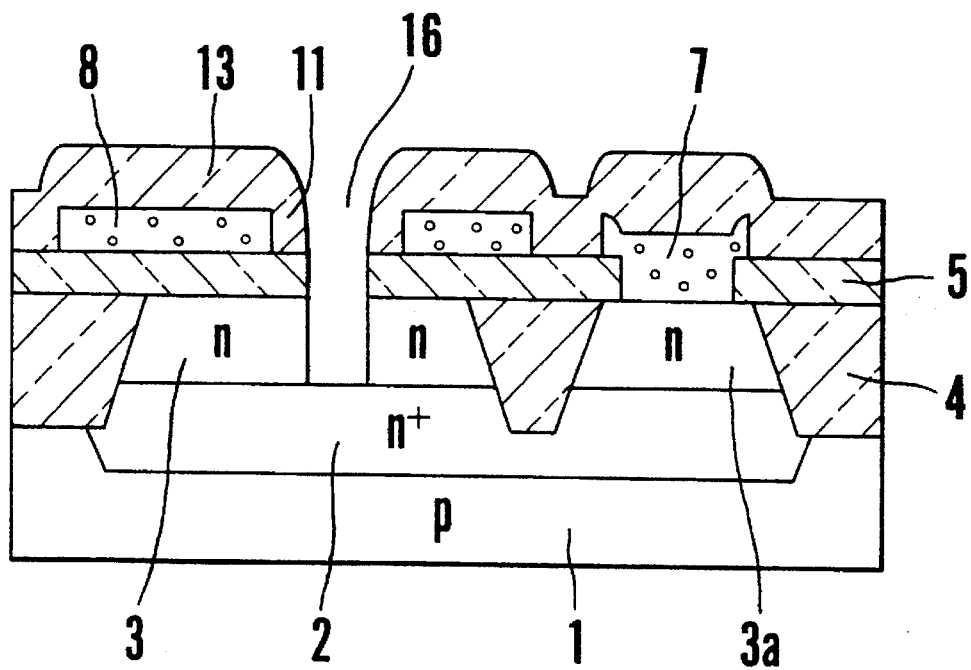
FIG. 6 is a sectional view showing part of the manufacturing process of the second embodiment shown in FIG. 5.

A method of manufacturing this transistor will be described below. For example, in the step in FIG. 4A, the n-type silicon epitaxial layer 3 is formed to have a concentration of, e.g., 1E17 cm$^{-3}$. As shown in FIG. 6, a second insulating interlayer 13 and the n$^+$-type emitter polysilicon film 8 are removed by anisotropical etching at a position where a base contact is to be formed to form a base contact hole 16. In addition, an insulating film is deposited on the entire surface of the resultant structure, and this insulating film is anisotropically etched to form an insulating side wall 11. A first insulating interlayer 5 is removed by etching until the surface of the silicon epitaxial layer 3 is exposed. A portion, which is not covered with the insulating film, of the silicon epitaxial layer 3 is removed by anisotropical etching until the surface of an n$^+$-type low-resistance region 2 is exposed.

After the portion exposed by anisotropically etching the n$^+$-type low-resistance region 2 and the n-type silicon epitaxial layer 3 is oxidized to a depth of about 10 nm and then wet-etched to remove the oxide film, thereby removing damage occurring due to the anisotropical etching.

Thereafter, as shown in FIG. 5, the lightly doped collector epitaxial layer 19 is selectively formed on the portion where the n-type silicon epitaxial layer 3 is removed, and an epitaxial base layer 6 is grown. At this time, if the height of the lightly doped collector epitaxial layer 19 is set to be higher or lower than that of the surface of the n-type silicon epitaxial layer 3 within a range of the p-type epitaxial base layer 6, any problem is not posed because the p-type epitaxial base layer 6 is connected to the n$^+$-type emitter polysilicon film 8. In this case, using $Si_2H_6$ as a source gas for a growth process and $PH_4$ as an n-type doping gas, a selective growth process can be typically performed at a temperature of 560°, a pressure of $2\times10^{-5}$ Torr, an $Si_2H_6$ flow rate of 70 sccm, and a growth rate of 7 nm/min.

In the steps following the above steps, as in the first example, an emitter contact hole and a collector contact hole are formed. The emitter diffusion layer 10 is formed by thermal diffusion. Finally, electrodes are formed, thereby completing the transistor shown in FIG. 5.

As described above, in the second embodiment, the collector concentration of the portion immediately below the n-type emitter diffusion layer 10 can be set to be 1E17 cm$^{-3}$. When the concentration of the lightly doped collector epitaxial layer 19 is set to be 5E16 cm$^{-3}$, the capacitance of a collector-base junction can be decreased. For this reason, the high-frequency characteristics of the device can be improved. Note that a cut-off frequency of 15 GHz could be obtained in the transistor of the first embodiment, and a cut-off frequency could be increased to 25 GHz in the transistor of the second embodiment.

As has been described above, a base is formed by a selective epitaxial method, and an impurity is diffused from a polysilicon film in contact with the peripheral portion of the base to form an emitter. For this reason, the base and emitter can be formed with good controllability, and an emitter-base junction is formed in an epitaxial base layer. Therefore, a problem such as base leakage is not posed.

In addition, the concentration of the silicon epitaxial layer immediately below an emitter diffusion layer region can be selectively increased, a Kirk effect can be suppressed, thereby improving the high-frequency characteristics of the transistor.

What is claimed is:

1. A semiconductor device comprising:

a low-resistance region of a second conductivity type formed on a monocrystalline semiconductor substrate of a first conductivity type, a first monocrystalline semiconductor film of the second conductivity type formed on said low resistance region, a first insulating film formed on a surface of said first monocrystalline semiconductor film and having a first opening, a first polycrystalline semiconductor film of the second conductivity type formed on said first insulating film and having a horizontal overhung portion extending from an entire peripheral portion of said first opening to an inside of said first opening to have a predetermined length, a second polycrystalline semiconductor film of the second conductivity type formed downward from a bottom surface of said overhung portion, and a second monocrystalline semiconductor film of the first conductivity type formed on a surface of said first monocrystalline semiconductor film in said first opening, a thickness of said second monocrystalline semiconductor film being at least twice that of the said second polycrystalline semiconductor film;

wherein said second polycrystalline semiconductor film and said second monocrystalline semiconductor film are connected to each other in said first opening, and wherein a diffusion layer of the second conductivity type is formed in said second monocrystalline semiconductor film through a connection portion between said second polycrystalline semiconductor film and said second monocrystalline semiconductor film.

2. A device according to claim 1, wherein a third monocrystalline semiconductor film of the second conductivity type extending from a surface of said first monocrystalline semiconductor film of the second conductivity type to said low-resistance region of the second conductivity type is formed on said first monocrystalline semiconductor film of the second conductivity type immediately below a second opening surrounded by a second insulating film.

3. A device according to claim 1, wherein said second monocrystalline semiconductor film consists of silicon.

4. A device according to claim 2, wherein an impurity concentration of said first monocrystalline semiconductor film is not less than $1E17$ cm$^{-3}$, and a concentration of said third monocrystalline semiconductor film is not more than $5E16$ cm$^{-3}$.

5. A device according to claim 1, wherein said diffusion layer of the second conductivity type is formed along a peripheral portion of said first opening to have an annular shape.

* * * * *